United States Patent [19]

Aton

[11] Patent Number: 5,053,699
[45] Date of Patent: Oct. 1, 1991

[54] SCANNING ELECTRON MICROSCOPE BASED PARAMETRIC TESTING METHOD AND APPARATUS

[75] Inventor: Thomas J. Aton, Dallas, Tex.

[73] Assignee: Texas Instruments Incorporated, Dallas, Tex.

[21] Appl. No.: 529,062

[22] Filed: May 25, 1990

[51] Int. Cl.$^5$ ............................................ G01R 31/28
[52] U.S. Cl. .............................. 324/158 R; 324/73.1; 324/158 D; 250/306
[58] Field of Search .............. 324/158 R, 158 D, 73.1, 324/71.3; 250/310, 311, 306, 307, 492.2; 356/398, 445, 72

[56] References Cited

U.S. PATENT DOCUMENTS

| | | | |
|---|---|---|---|
| 4,581,578 | 4/1986 | Honma et al. | 324/158 R |
| 4,629,898 | 12/1986 | Orloff et al. | 324/158 D |
| 4,755,748 | 7/1988 | Lin | 324/158 D |
| 4,871,919 | 10/1989 | Donohue et al. | 250/306 |
| 4,918,309 | 4/1950 | Beha et al. | 250/306 |

OTHER PUBLICATIONS

Aton, T., Garth, S. C. J., Sackett, J. N., and Spicer, D. F.; Characteristics of a Virtual Immersion Lens Spectrometer for Electron Beam Testing. J. Vac. Sci. Technol. B 6(6), Nov./Dec. 1988, pp. 1953-1957.

*Primary Examiner*—Kenneth A. Wieder
*Assistant Examiner*—Vinh P. Nguyen
*Attorney, Agent, or Firm*—James C. Kesterson; James T. Comfort; Melvin Sharp

[57] ABSTRACT

A scanning electron microscope (SEM) (24), or other irradiating device, is used to create a potential in sample areas (39b) of a test structure (39) formed on the surface of an integrated circuit wafer. A conduction path between the irradiated sample area and a common area (39a) is detected via an ammeter (40) connected between the sample area (39b) and a voltage source (42). Monitoring circuit (44) produces an output indicative of those sample areas (39b) which are electrically coupled to the common area (39a).

30 Claims, 2 Drawing Sheets

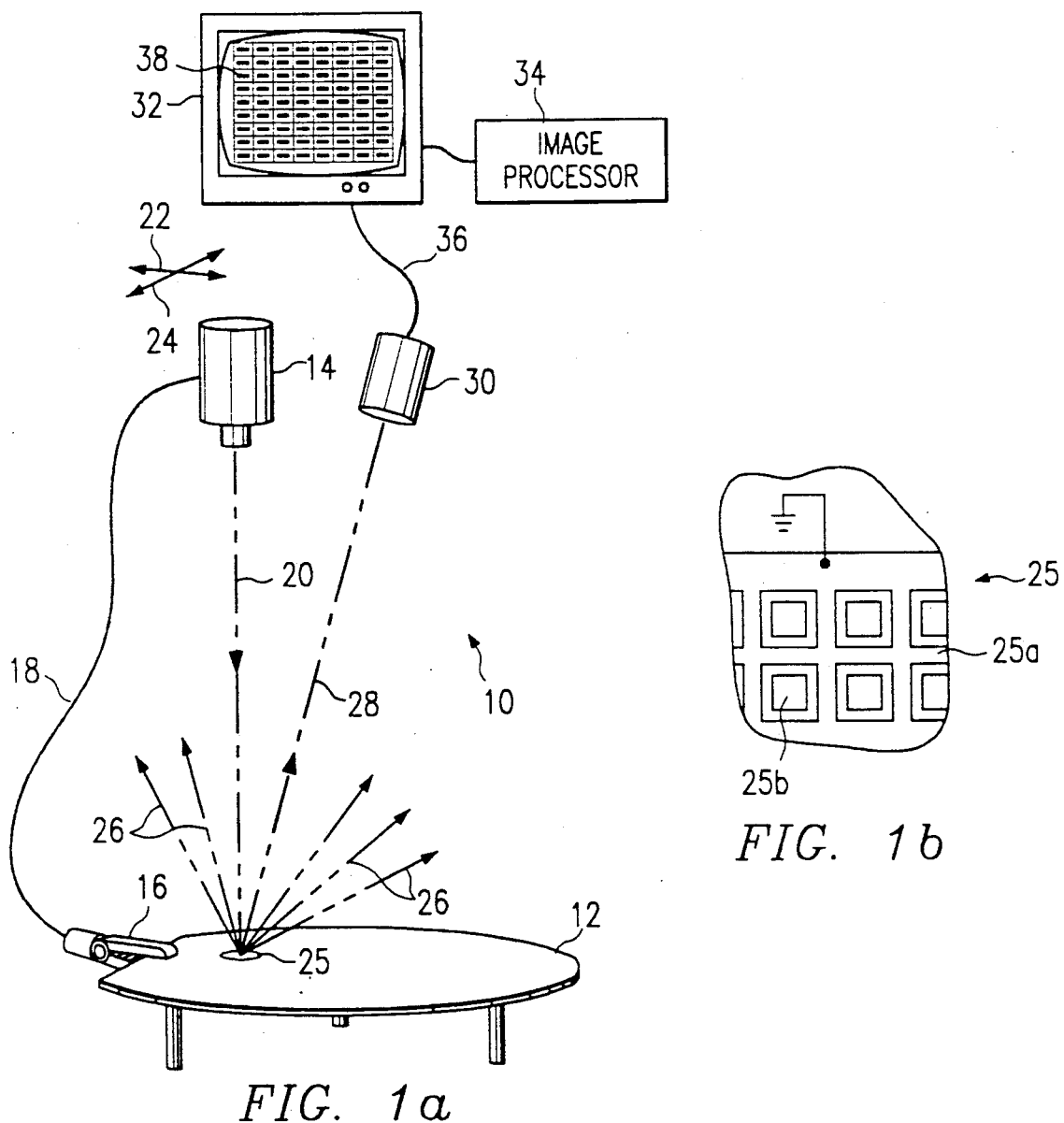
FIG. 1a
FIG. 1b
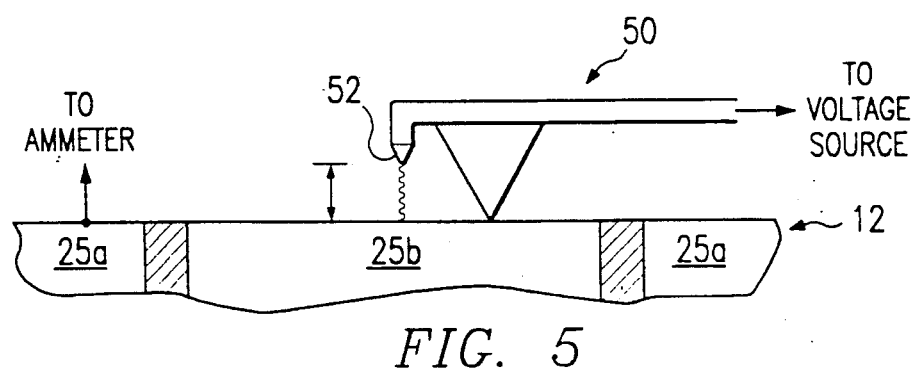
FIG. 5

SCANNING ELECTRON MICROSCOPE BASED PARAMETRIC TESTING METHOD AND APPARATUS

RELATED APPLICATIONS

This application is related to U.S. patent application Ser. No. 327,080, now U.S. Pat. No. 4,978,908 entitled "Scanning Electron Microscope Based Parametric Testing Method and Apparatus", filed Mar. 22, 1989, to Mahant Shetti et al., incorporated by reference herein.

TECHNICAL FIELD OF THE INVENTION

This invention relates in general to semiconductor processing, and more particularly to a method and apparatus for testing of semiconductor integrated circuits.

BACKGROUND OF THE INVENTION

An important aspect of semiconductor fabrication is the testing of circuit structures to insure that design specifications are met and for isolating sources of defects in the wafer processing. In general, testing each layer or fabrication step during fabrication has been impractical. Because of the time and expense involved, only limited in-process testing is possible. The available in-process testing methods provide only limited information which is both untimely and inadequate. In particular, the prior art methods do not provide information on the defect density (i.e., the percentage of failed devices on the chip). Circuit testing structures performed on the circuit after complete fabrication give even more limited information on processing and design errors because it is difficult to determine the level on which the error occurred.

One prior method of testing comprises placing a comb-like test structure having interleaving tines and integral probe pads on the semiconductor wafer. The test structure is built during the integrated circuit fabrication or on a separate pilot wafer and reflects the structures and intricacy required therein. Once the integrated circuit is completed, a mechanical probe testing device is used to contact the probe pads on the test structure and an electrical readout is obtained. The readout provides little more than a pass/fail indication with no fault location information. Additionally, the use of a mechanical probe testing device requires the use of probe pads for contact between the test structure and the probes. Since the probe pads often require significantly more space than the test structure itself due to the size of the probes, there is an inherent wasting of valuable wafer surface space.

Another test architecture is described in U.S. patent Ser. No. 327,080 to Mahant Shetti et al., filed Mar. 22, 1989, now U.S. Pat. No. 4,978,908, entitled "Scanning Electron Microscope Based Parametric Testing Method and Apparatus," which is incorporated by reference herein. In this test architecture, a scanning electron microscope produces an electron beam which is aimed at a test structure comprising a plurality of islands formed within a grid of structure. Secondary electrons emitted from the islands are displayed on a monitor. This information can detect whether the island is electrically separated from the grid or shorted thereto by comparing the intensity of the secondary electrons emitted from the islands.

While this test system is very effective, it is limited in the test data which may be obtained on structures over which a material layer, such as an oxide layer, has been formed.

Therefore, a need has arisen in the industry for a test method and apparatus which may accurately test integrated circuits design specifications during fabrication.

SUMMARY OF THE INVENTION

In accordance with the present invention, a integrated circuit testing method and apparatus is provided which substantially eliminates the disadvantages and problems associated with prior art devices.

In the present invention, the test structure is formed on a wafer undergoing fabrication. The test structure has a first and second conductive areas fabricated on the wafer. A current into the first conductive area and circuitry is coupled to the second conductive area for detecting a current between the first and second conductive areas.

The present invention provides the advantage that devices can be tested during fabrication. Further, with a sufficient beam energy, structures beneath a material layer, such as an oxide layer, may be tested as well.

In one aspect of the present invention, an electrode is placed close enough to the surface of the wafer such that a current may be generated through the air to the first conductive area. This aspect of the invention allows testing without the need for a vacuum.

BRIEF DESCRIPTION OF THE DRAWING

For a more complete understanding of the present invention, and the advantages thereof, reference is now made to the following descriptions taken in conjunction with the accompanying drawings, in which:

FIG. 1a illustrates a perspective view of a previously developed integrated circuit testing device;

FIG. 1b illustrates a perspective view of a test structure used in connection with the device of FIG. 1a;

FIG. 4b illustrates a schematic representation of a diode being tested using the embodiment of FIG. 4a; and FIG. 5 illustrates a third embodiment of the present invention.

DETAILED DESCRIPTION OF THE INVENTION

Figure 2:
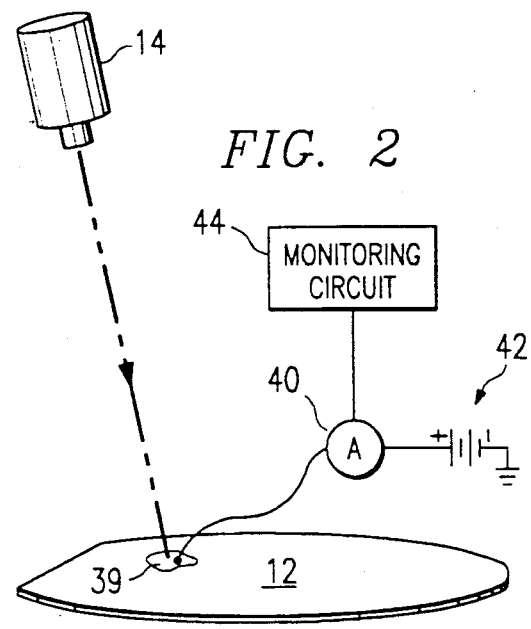
FIG. 2 illustrates a first embodiment of the integrated circuit testing device of the present invention.

The preferred embodiment of the present invention is best understood by referring to FIGS. 1-5 of the drawings, like numerals being used for like and corresponding parts of the various drawings.

FIGS. 1a-b illustrate a test device described in U.S. patent application Ser. No. 327,080, entitled "Scanning Electron Microscope Based Parametric Testing Method and Apparatus," to Mahant Shetti et al, filed Mar. 22, 1989, which is incorporated by reference herein. The apparatus 10 is generally positioned along a standard semiconductor integrated circuit fabrication line which is in a clean environment.

The apparatus 10 comprises a scanning electron microscope (SEM) 14 which is electrically connected to the wafer 12 by any appropriate method, such as by a clamp 16 and a connector cable 18. The SEM 14 emits an electron beam 20 at the wafer 12. The beam 20 is capable of movement as indicated by arrows 22 and 24 to scan the wafer 12 in a raster format. Electrons in the electron beam 20 strike the surface of the wafer 12 irradiating a test structure 25 such as that shown in FIG. 1b, having a common area 25a and sample areas (or "islands") 25b. The beam 20 causes other electrons from the impinged sample area to be released. The released or "secondary" electrons, as indicated by lines 26 travel in all directions from the wafer 12. Certain ones of the secondary electrons, as indicated by line 28, are detected by an electron multiplier 30 or other detectors well known in the art which provides a signal to a monitor 32 or other data processing equipment such as an image processor 34 by a cable 36. The monitor 32 presents an image 38 corresponding to the test structure 25 formed on the wafer 12.

By using the SEM 14 to scan a test structure on the wafer 12, an easily evaluated image 38 is provided. An operator can scan the wafer 12 as soon as a level of fabrication is completed. The apparatus 10 can already be placed on a fabrication line in the clean environment to provide immediate and accurate test results without fear of circuit contamination. Although not shown, it is to be understood that other than electron beams may be used. For example, ion beams, photon beams or a combination thereof with electron beams may be used to irradiate the test structures with equal success.

Figure 3A:
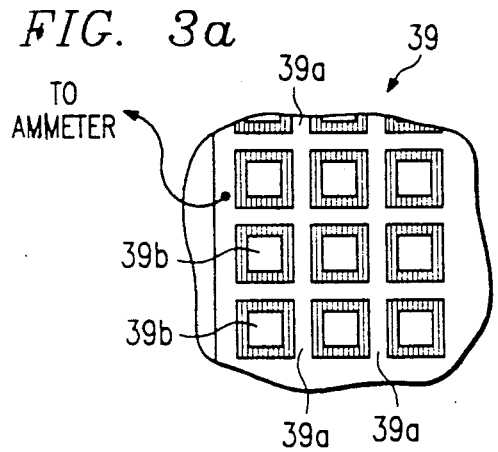
FIGS. 3a-b illustrate an test structures used with the device of FIG. 2.

FIGS. 2 and 3a illustrates a first embodiment of the present invention. As described in connection with FIG. 1a, a SEM (or other irradiating beam source, such as an ion beam source or a photon beam source) is used irradiate a test structure 39 (shown in FIG. 3a) having common areas 39a and sample areas 39b. An ammeter 40 is electrically coupled between the common area 39a and a predetermined voltage 42. Typically, the voltage 42 is set to ground; however, in some instances, it may be desirable to have a voltage which is greater than or less than ground.

The output of the ammeter 40 is connected to a monitoring circuitry 44. The monitoring circuitry 44 is operable to correlate the current measured by the ammeter 40 with the location of the sample area 39b being irradiated.

In operation, the SEM 14 generates a beam which produces a current into one of the sample areas 39b. If the sample area 39b being irradiated is isolated from the common area 39a, then the ammeter will not detect any current between the common area and the voltage source 42. If, however, the sample area 39b being irradiated is coupled to the common area 39a, then a current will be detected by the ammeter 40. This will result in a signal being passed to the monitoring circuitry such that the presence of a low impedance connection between the sample area 39b and the common area 39a is noted. The magnitude of the current will be directly related to the impedance between the sample area 39b and the common area 39a.

This embodiment of the present invention provides several technical advantages over the circuit shown in FIG. 1. First, the SEM could generate an electron beam with sufficient energy to penetrate a material layer, such as an oxide or nitride layer, formed over the test structure 39. Typically, a beam having an energy in excess of 20 KeV would be necessary. Such a material layer would prevent the detection of secondary electrons as shown in FIG. 1; however, since the present invention determines a current path between the common area 39a and the sample areas 39b without the need for detecting secondary electrons, the wafer may be tested through the material layer.

Similarly, a protective overcoat is often formed over the surface of the wafer 12. In order to allow the SEM 30 to irradiate the sample areas 39b, windows are formed through the protective overcoat. In the apparatus 10 of FIG. 1, the windows would be made as large as possible, since the size of windows will directly affect the number of secondary electrons detected. I the apparatus of FIG. 2, however, the windows can be made small, since the detection of secondary electrons is not necessary.

Other variations may be provided for in the circuit of FIG. 2, depending on the application. For example, if a specific sample area 39b is to be tested, the SEM 24 is typically not accurate enough to pinpoint a specific sample area 39b while maintaining a small beam size. In this instance, it may be desirable to provide apparatus to move the wafer 12, rather than the electron beam. The Wafer 12 may be accurately located by using presently available positioning techniques, such as laser interferometers.

Figure 3B:
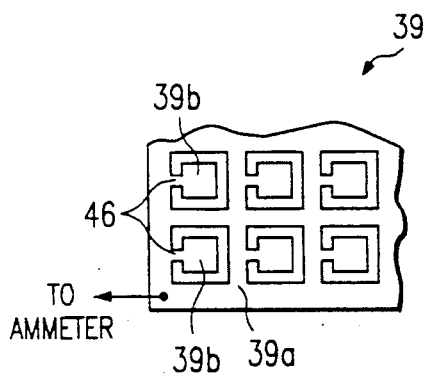

FIG. 3b illustrates an alternative test structure 39 in which the sample areas 39b are intentionally shorted to the common area 39a through bridges 46. If desired, the bridges may be made at various widths. At some width, an open circuit will occur between the associated sample area 39b and the common area 39a. By using the test structure 39 illustrated in FIG. 3, the smallest width which may be formed using a given process may be determined.

Figure 4A:
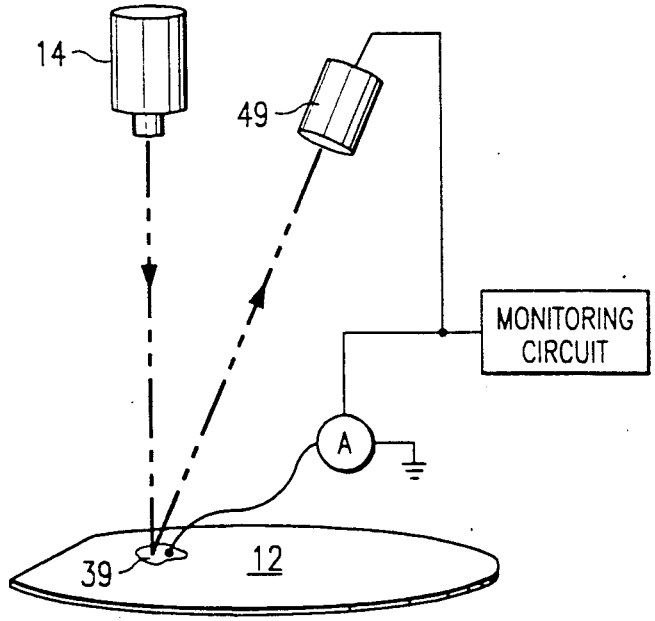
FIG. 4a illustrates a second embodiment of the present invention wherein the i-v characteristics of an integrated circuit device may be tested.
Figure 4B:
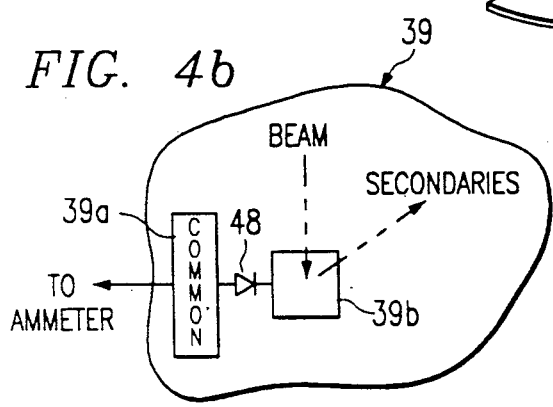

FIG. 4a illustrates a second embodiment of the test apparatus of the present invention wherein the current and voltage characteristics of a device 48 (such as the diode shown in FIG. 4b) may be determined. In this embodiment, the SEM 14 (or other beam source) produces a beam which irradiates a sample area 39b coupled to a device, such as the diode illustrated in FIG. 4b. The sample area 39b is coupled to the cathode of a diode 48 and the common area 39a is coupled to the anode of the diode 48. The ammeter 40 is connected between the common area 39a and the voltage source 42, shown as ground. Other devices, such as transistors, could be similarly tested.

In operation, the sample area 39b is irradiated by the SEM 14, resulting in a voltage generated on the cathode of the diode 48 and a current through the ammeter 40. The voltage on the cathode may be determined from the release of secondary electrons. The energy of the secondary electrons may be detected by a secondary electron analyzer 49 such as described in "Characteristics of a Virtual Immersion Lens Spectrometer for Electron Beam Testing" by Aton et al., J. Vac. Sci. Technol. B, Vol. 6, No. 6, Nov/Dec 1988, (p. 1953). The kinetic energy of the secondary electrons detected by the secondary electron analyzer 49 may be correlated with the voltage on the sample area 39b and the cathode. Hence, the current-voltage characteristics of the device may be determined.

FIG. 5 illustrates a third embodiment of the present invention wherein an electrode (or "tip") 52 or field emission tip is positioned close enough to the surface of the wafer that a current may be generated through air (or other ambient such as nitrogen or argon). Preferably, the tip 52 is held within a few angstroms of the surface of the wafer. For example, an atomic force microscope (which is a variation of a scanning tunnelling microscope) includes a pointed tip 52 which may be held above the wafer 12 at a distance of 2 or 3 angstroms. The tip 52 may be connected to a voltage source which could result in a micro-beam of current between the tip 52 and the sample area 25b either by tunnelling or by field emission. This provides a significant advantage, in some instances, over the apparatus of FIG. 2, since the electron beam produced by the SEM must be used in a vacuum. Hence, by using an electrode placed sufficiently close to the wafer surface, the complications involved in testing under a vacuum may be avoided.

Although the present invention has been described in detail, it should be understood that various changes, substitutions and alterations can be made herein without departing from the spirit and scope of the invention as defined by the appended claims.

What is claimed is:

1. Apparatus for testing fabrication processes on a wafer including a test structure having first and second conductive areas separated by a non-conductive area, comprising:
   a device operable to generate a current in said first conductive area without physical contact; and
   current detecting circuitry coupled in the test structure for detecting current between said first and second conductive areas of said test structure.

2. The apparatus of claim 1 wherein said current generating device is operable to generate an electron beam.

3. The apparatus of claim 1 wherein said current generating device is operable to generate a photon beam.

4. The apparatus of claim 1 wherein said current generating device is operable to generate an ion beam.

5. The apparatus of claim 1 wherein said current generating device is operable to generate a tunneling current.

6. The apparatus of claim 1 wherein said current generating device is operable to generate a field emission current.

7. The apparatus of claim 1 wherein said test structure comprises a plurality of first conductive areas.

8. The apparatus of claim 7 wherein said current detecting circuitry comprises circuitry for detecting a current between said second conductive area and a predetermined potential.

9. The apparatus of claim 1 wherein said current generating device is operable to generate a beam of sufficient energy to induce current in said first conductive area through a material layer.

10. Apparatus for testing fabrication processes whereby the smallest width which may be formed using a given process may be determined, on a wafer including a plurality of first conductive areas and a second conductive area, comprising:
    a device operable to generate a current in said first conductive area without physical contact; and
    current detecting circuitry coupled to the test structure for detecting current between said first and second conductive areas and between said second conductive area and a predetermined potential;
    wherein said first conductive areas are disposed at varying distances from said second conductive area such that the maximum resolution of the process forming the first conductive areas can be determined.

11. A method of testing a fabrication of an integrated circuit comprising the steps of:
    forming a test structure during fabrication including at least one first conductive area and a second conductive area separated by a non-conductive area;
    generating a current on the first conductive area without physically contacting the first conductive area; and
    detecting current between the first and second conductive areas.

12. The method of claim 11 wherein said step of generating a current comprises the step of generating an electron beam to irradiate the first conductive area.

13. The method of claim 11 wherein said step of generating a current comprises the step of generating an photon beam to irradiate the first conductive area.

14. The method of claim 11 wherein said step of generating a current comprises the step of generating an ion beam to irradiate the first conductive area.

15. The method of claim 11 wherein said step of generating a current comprises the step of generating an current between the first conductive area and an electrode proximate the surface of the first conductive area.

16. The method of claim 15 wherein said current generating step comprises the step of generating a tunnelling current.

17. The method of claim 15 wherein said current generating step comprises the step of generating a field emission current.

18. The method of claim 11 wherein said detecting step comprises the step of detecting a current flow though an ammeter coupled between the second conductive area and a predetermined potential.

19. The method of claim 11 wherein the generating step comprises the step of inducing a current in said first conductive area by generating a beam of sufficient energy to penetrate a material layer.

20. Apparatus for testing integrated device having first and second regions separated by a non-conductive region formed on a wafer comprising:
    a voltage generating device operable to generate a voltage in the first region of the integrated circuit device;
    a secondary electron detection device for determining the voltage on said first region from secondary electrons generated responsive to the voltage;
    current detecting circuitry coupled to the second region for detecting the current between the first and second regions.

21. The apparatus of claim 20 wherein said voltage generating device is operable to generate an electron beam.

22. The apparatus of claim 20 wherein said voltage generating device is operable to generate a photon beam.

23. The apparatus of claim 20 wherein said voltage generating device is operable to generate an ion beam.

24. The apparatus of claim 20 wherein said voltage generating device is operable to generate a tunneling current.

25. The apparatus of claim 20 wherein said voltage generating device is operable to generate a field emission current.

26. A method of testing an integrated circuit device having first and second portions separated by a non-conductive portion comprising the steps of:
    generating a voltage on the first portion;
    measuring the energy of secondary electrons produced responsive to the voltage to determine the magnitude of the voltage on said first portion; and measuring the current between the first and second portions.

27. The method of claim 26 wherein said step of generating a voltage comprises the step of generating an electron beam to irradiate the first conductive area.

28. The method of claim 26 wherein said step of generating a voltage comprises the step of generating an photon beam to irradiate the first conductive area.

29. The method of claim 26 wherein said step of generating a voltage comprises the step of generating an ion beam to irradiate the first conductive area.

30. The method of claim 26 wherein said step of generating a voltage comprises the step of generating an current between the first conductive area and an electrode proximate the surface of the first conductive area.

* * * * *